(12) United States Patent
Chen et al.

(10) Patent No.: US 10,993,342 B2
(45) Date of Patent: Apr. 27, 2021

(54) ELECTRONIC DEVICE

(71) Applicant: ASUSTeK COMPUTER INC., Taipei (TW)

(72) Inventors: Chui-Hung Chen, Taipei (TW);
Chia-Min Cheng, Taipei (TW);
Ching-Yuan Yang, Taipei (TW);
Cheng-Han Chung, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 15 days.

(21) Appl. No.: 16/528,739

(22) Filed: Aug. 1, 2019

(65) Prior Publication Data

US 2020/0060036 A1     Feb. 20, 2020

(30) Foreign Application Priority Data

Aug. 15, 2018   (CN) .......................... 201821310100.4

(51) Int. Cl.
*H05K 5/00* (2006.01)
*H05K 5/06* (2006.01)
*H05K 5/02* (2006.01)

(52) U.S. Cl.
CPC .............. *H05K 5/065* (2013.01); *H05K 5/02* (2013.01)

(58) Field of Classification Search
CPC ......... H05K 5/065; H05K 5/02; H04N 5/2254
See application file for complete search history.

(56) References Cited

U.S. PATENT DOCUMENTS

| | | | | |
|---|---|---|---|---|
| 7,907,840 B2* | 3/2011 | Schack | ............... | H04N 5/2254 396/177 |
| 9,692,953 B2* | 6/2017 | Xiong | ................. | G03B 11/043 |
| 9,762,781 B2* | 9/2017 | Evans, V | ............. | H04N 5/2257 |
| 10,812,698 B1* | 10/2020 | Zhou | .................... | G03B 17/561 |
| 2005/0014527 A1* | 1/2005 | Chambers | ............ | H04N 5/2256 455/556.1 |
| 2006/0261257 A1* | 11/2006 | Hwang | ............... | H04N 5/2259 250/216 |
| 2007/0253703 A1* | 11/2007 | Tsai | ........................ | H04N 7/142 396/429 |
| 2008/0064437 A1* | 3/2008 | Chambers | .......... | H04N 1/00307 455/556.1 |
| 2014/0002971 A1* | 1/2014 | Chung | ................. | H05K 5/0217 361/679.01 |
| 2015/0189175 A1* | 7/2015 | Fan | ..................... | H04N 5/23238 348/37 |
| 2017/0223158 A1* | 8/2017 | Yin | ........................ | H04M 1/02 |

(Continued)

*Primary Examiner* — Hung S. Bui
*Assistant Examiner* — Sagar Shrestha
(74) *Attorney, Agent, or Firm* — McClure, Qualey & Rodack, LLP

(57) ABSTRACT

The disclosure discloses an electronic device, and the electronic device includes: a housing, a waterproof structure, a functional module, and a driving member. The housing has an inner surface and an opening connected to each other. The waterproof structure has a first end surface, a second end surface, and a side wall connecting the first end surface and the second end surface. The first end surface tightly connected with the inner surface in a sealing manner. The functional module is disposed inside the waterproof structure. The driving member is located in the housing, and is configured to drive the functional module to move toward or away from the opening.

14 Claims, 10 Drawing Sheets

(56) References Cited

U.S. PATENT DOCUMENTS

| | | | |
|---|---|---|---|
| 2018/0262663 A1* | 9/2018 | Zhang | H04N 5/2254 |
| 2018/0330215 A1* | 11/2018 | Zeng | G06K 19/005 |
| 2019/0014201 A1* | 1/2019 | Bao | H04M 1/0264 |
| 2019/0033926 A1* | 1/2019 | Huang | H04M 1/0264 |
| 2019/0069413 A1* | 2/2019 | Kasugai | H05K 1/189 |
| 2019/0082548 A1* | 3/2019 | Wu | H01F 7/064 |
| 2019/0129466 A1* | 5/2019 | Zeng | H04M 1/0237 |
| 2019/0132971 A1* | 5/2019 | Zeng | H01F 7/06 |
| 2019/0138062 A1* | 5/2019 | Zeng | H04M 1/0237 |
| 2020/0177716 A1* | 6/2020 | Chen | H04M 1/0264 |
| 2020/0213491 A1* | 7/2020 | Huang | H04N 5/232 |

\* cited by examiner

ELECTRONIC DEVICE

CROSS-REFERENCE TO RELATED APPLICATION

This application claims the priority benefit of China Application Serial No. 201821310100.4, filed on Aug. 15, 2018. The entirety of the above-mentioned patent application is hereby incorporated by reference herein and made a part of the specification.

BACKGROUND OF THE INVENTION

Field of the Invention

The disclosure relates to an electronic device.

Description of the Related Art

Currently, a mobile phone featured with waterproof is a demanding characteristic. Especially the mobile phone with a telescopic camera, a waterproof ring is usually disposed at a telescopic opening of a camera module. However, the problems of friction and assembly difficulties between the camera and the waterproof ring make it difficult to improve the waterproof reliability.

BRIEF SUMMARY OF THE INVENTION

According to one aspect of the disclosure, an electronic device is provided herein. The electronic device includes: a housing, having an inner surface and an opening connected to each other; a waterproof structure, having a first end surface, a second end surface, and a side wall connecting the first end surface and the second end surface, wherein the first end surface is tightly connected with the inner surface; a functional module, disposed inside the waterproof structure; and a driving member, located in the housing and configured to drive the functional module to move toward or away from the opening.

The waterproof structure of the disclosure forms an accommodating space inside the housing with an opening. The functional module is completely isolated from other elements of the electronic device. In this way, when water enters the accommodating space through the opening, water only exists in the gap between the waterproof structure and the functional module instead of flows into the housing directly, thus to avoid damage of the electronic elements inside the electronic device.

DETAILED DESCRIPTION OF THE EMBODIMENTS

Figure 1A:
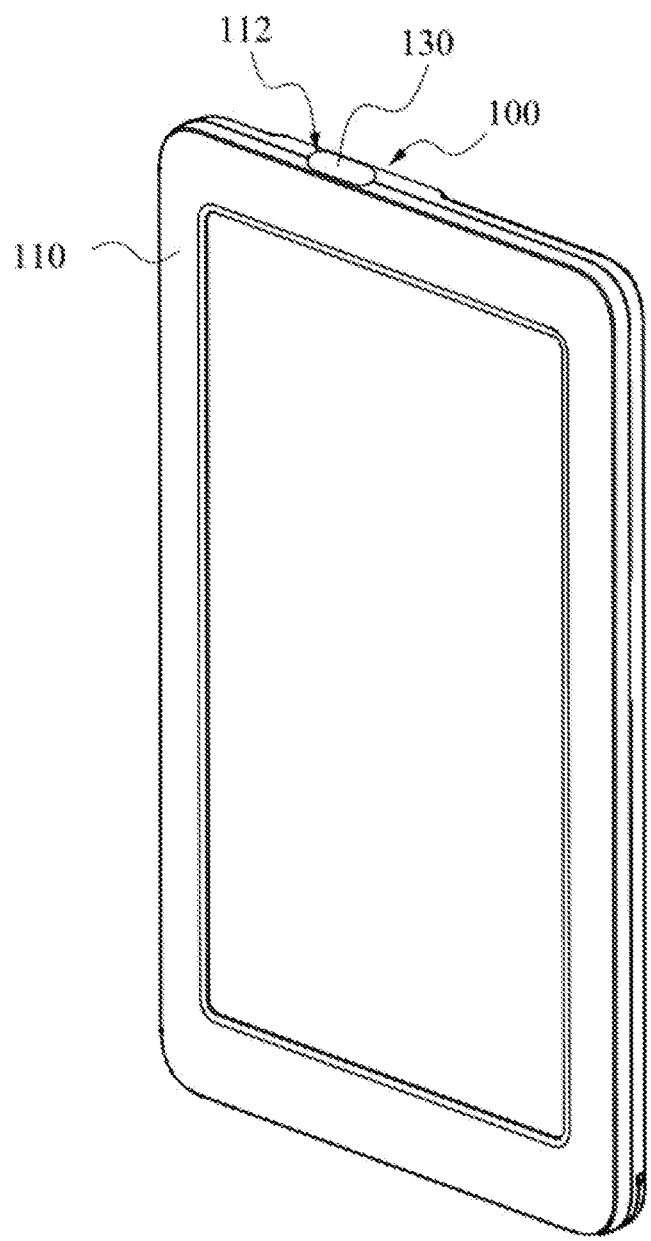
FIG. 1A is a three-dimensional view of an electronic device according to an embodiment of the disclosure, where a functional module is located in a housing of the electronic device.

The following will disclose a plurality of embodiments of the disclosure in the accompanying drawings. For specificity, lots of practical details will be illustrated together in the following descriptions. However, it should be learned that these practical details are not intended to limit the disclosure. To be specific, in some of the embodiments of the disclosure, these practical details are not necessary. In addition, to simplify the accompanying drawings, some known common structures and elements will be drawn in the accompanying drawings in a simple illustrative manner. In addition, for clarity, the thicknesses of layers and areas in the accompanying drawings are exaggerated, and same reference numerals represent same elements in the descriptions of the accompanying drawings.

Figure 1B:
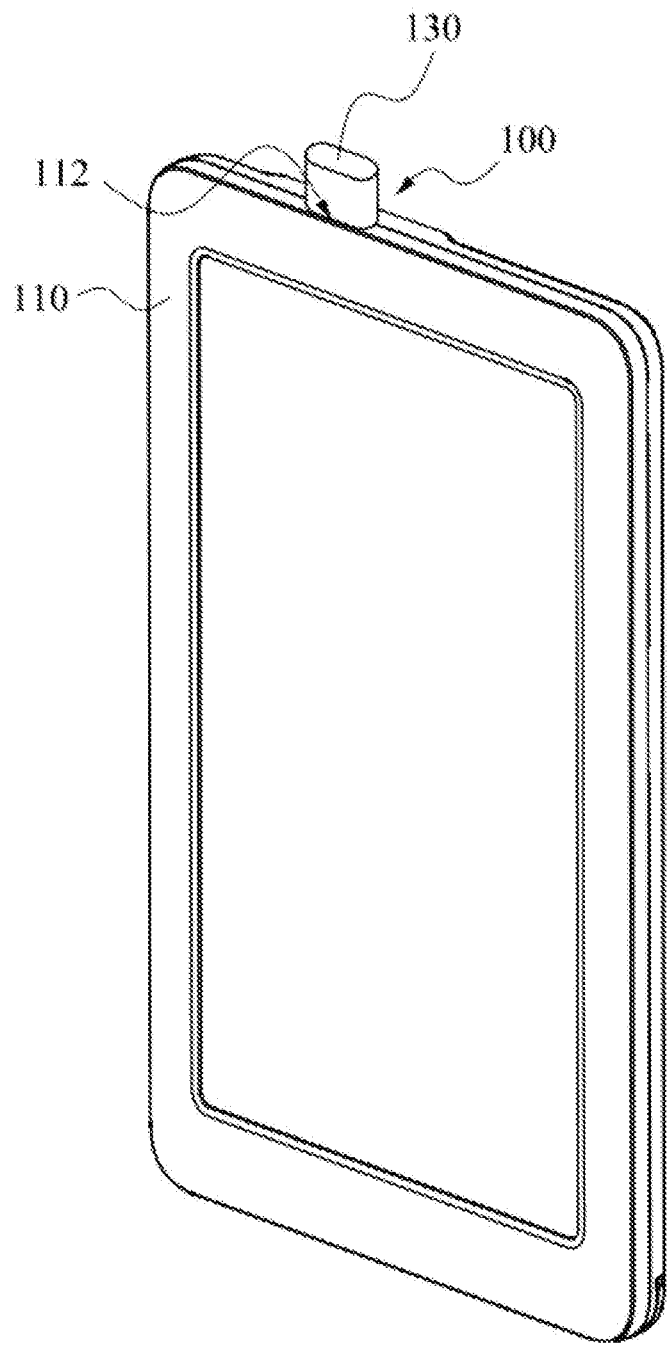
FIG. 1B is another three-dimensional view of the electronic device in FIG. 1A, where the functional module extends out of the housing of the electronic device.

FIG. 1A is a three-dimensional view of an electronic device 100 according to an embodiment of the disclosure, where a functional module 130 is located in a housing 110 of the electronic device 100. FIG. 1B is another three-dimensional view of the electronic device 100 in FIG. 1A, where the functional module 130 extends out of the housing 110 of the electronic device 100. The electronic device 100 includes the functional module 130 and the housing 110, and the housing 110 includes an opening 112. The functional module 130 is a camera module or a flash module. The functional module 130 is telescopic at the opening 112. As shown in FIG. 1A, when the functional module 130 is retracted, the functional module 130 is located inside the housing 110, and most of the volume of the functional module 130 is located in the housing 110. As shown in FIG. 1B, when the functional module 130 is pushed out, most of the volume of the functional module 130 is located outside the housing 110.

Figure 2:
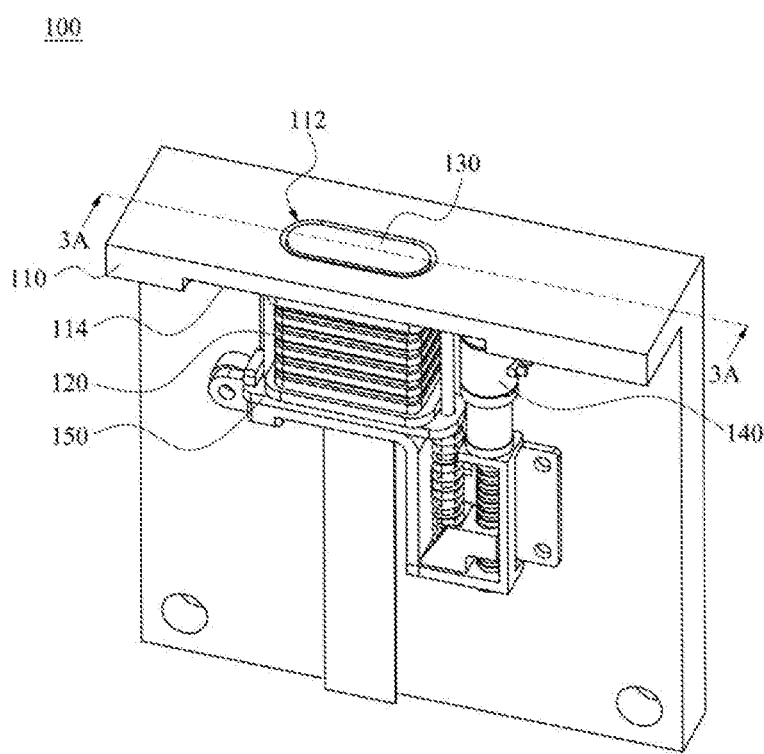
FIG. 2 is a three-dimensional view of the electronic device in FIG. 1A after a part of the housing is removed.
Figure 3A:
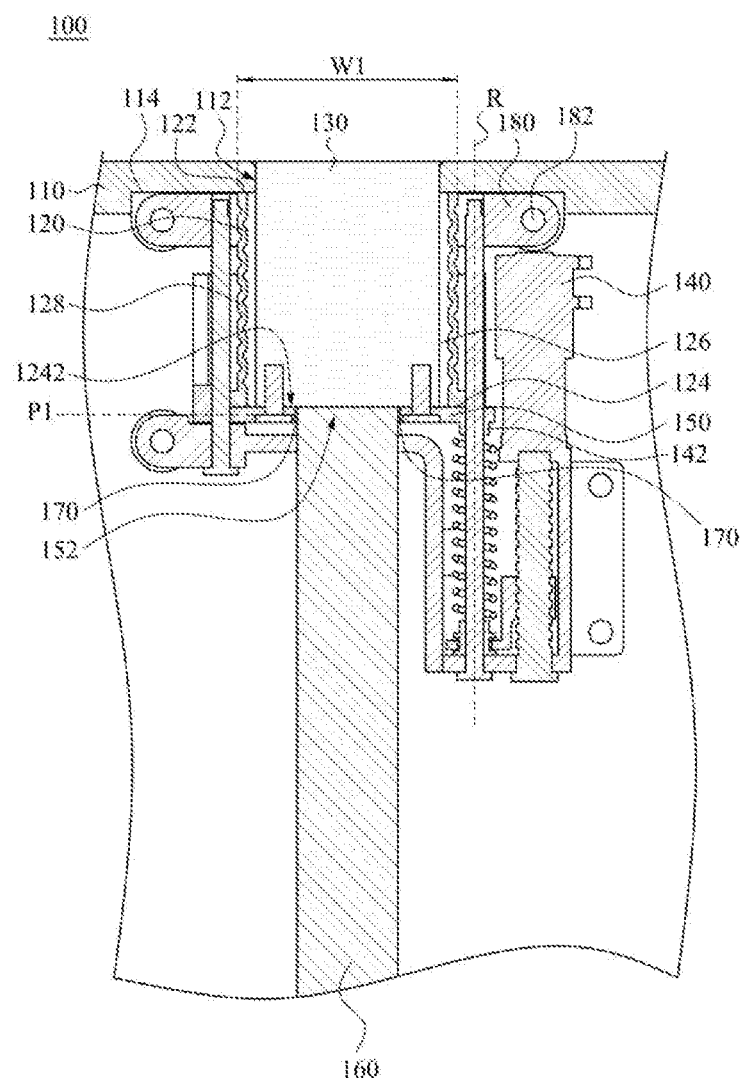
FIG. 3A is a cross-sectional view of the electronic device in FIG. 2 taken along a line 3A-3A.
Figure 3B:
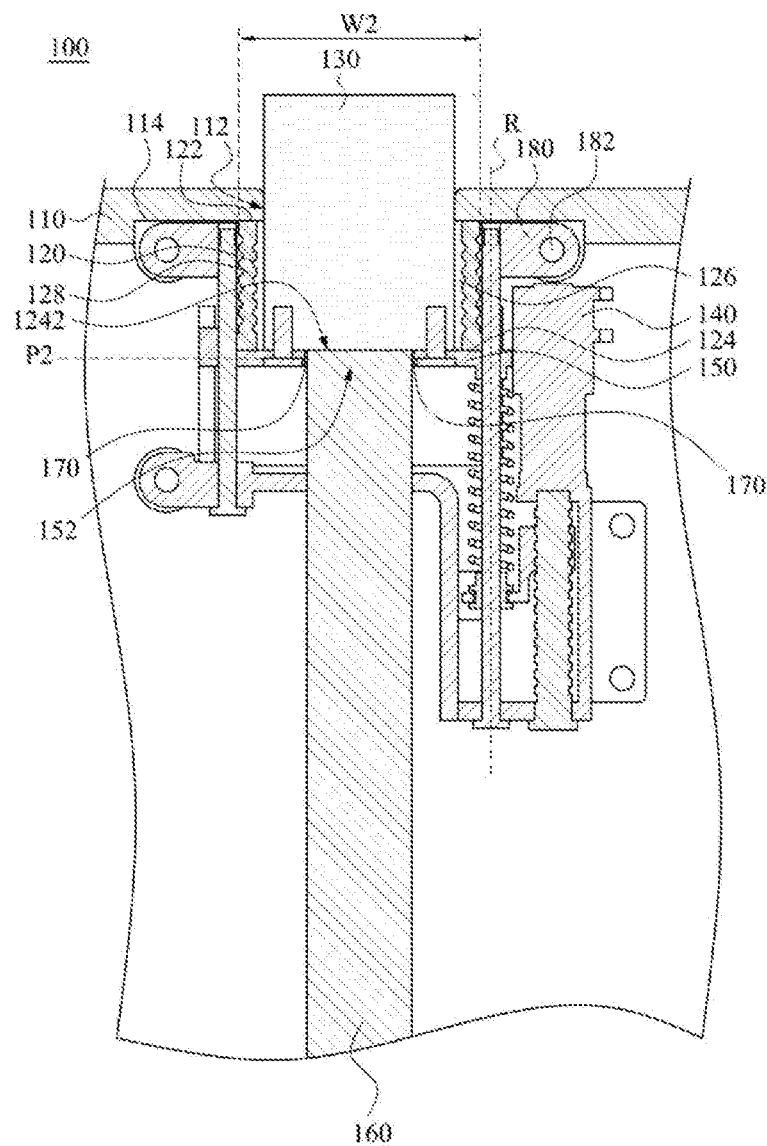
FIG. 3B is another cross-sectional view of the structure in FIG. 3A, where the functional module extends out of the housing of the electronic device.

FIG. 2 is a front view of the electronic device 100 in FIG. 1A after a part of the housing 110 is removed. FIG. 3A is a cross-sectional view of the electronic device 100 in FIG. 2 taken along a line 3A-3A. FIG. 3B is a cross-sectional view showing that the functional module 130 in FIG. 3A extends out of the housing 110 of the electronic device 100.

Refer to FIG. 2, FIG. 3A, and FIG. 3B. The electronic device 100 further includes the housing 110, a waterproof structure 120, a driving member 140, and a bottom plate 150. The housing 110 has an opening 112 and an inner surface 114 connected to each other. The functional module 130 is disposed on the bottom plate 150, and the waterproof structure 120 surrounds the functional module 130. In this embodiment, the functional module 130 is fastened to the bottom plate 150 by a screw, but the disclosure is not limited thereto.

Figure 3C:
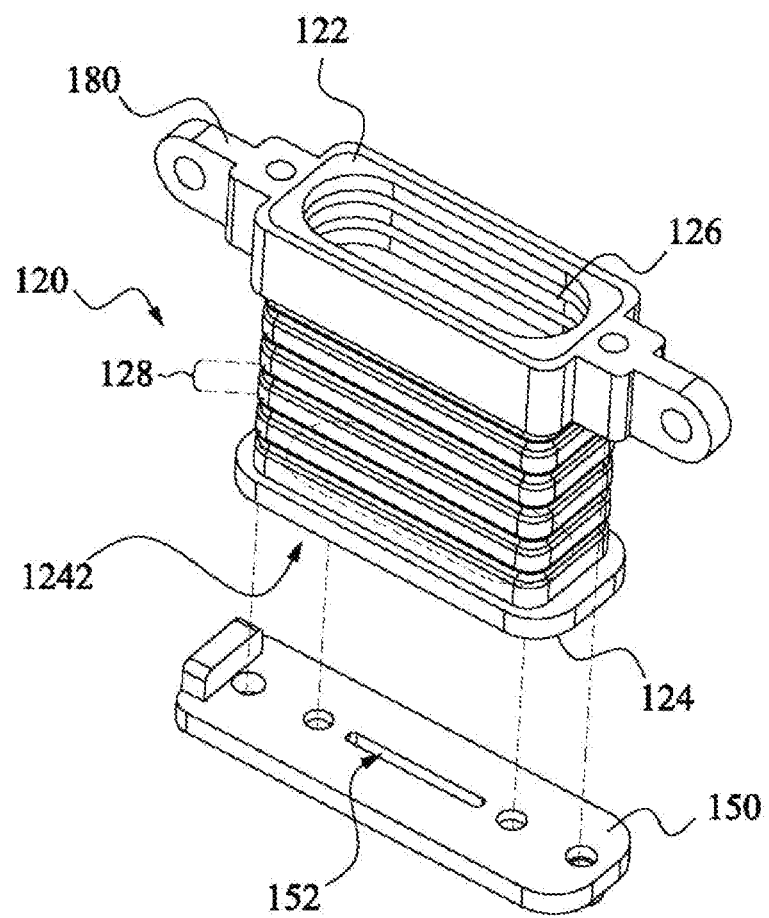
FIG. 3C is a three-dimensional view of a partial structure in FIG. 2, where a bottom plate is separated from a waterproof structure.

FIG. 3C is a three-dimensional view of a partial structure in FIG. 2, where a bottom plate 150 is separated from a waterproof structure 120. Refer to FIG. 3A, FIG. 3B, and FIG. 3C. The waterproof structure 120 has a first end surface 122, a second end surface 124, and a side wall 126 connecting the first end surface 122 and the second end surface 124. The first end surface 122 of the waterproof structure 120 is tightly connected with the inner surface 114 of the housing 110, and the second end surface 124 is tightly connected with the bottom plate 150. The second end surface 124 has an end surface opening 1242. The bottom plate 150 has a bottom plate opening 152. The bottom plate opening 152 is disposed corresponding to the end surface opening 1242. A space defined by the side wall 126 is connected with the opening 112 of the housing 110 to jointly form an accommodating space. The functional module 130 is located in the accommodating space. In addition, the functional module 130 does not contact an inner wall of the waterproof structure 120, to form a gap surrounding a periphery of the functional module 130.

The electronic device 100 further includes a wire material 160 and a sealant 170. The wire material 160 passes through the bottom plate opening 152 of the bottom plate 150 and the end surface opening 1242 of the second end surface 124, to connect to the functional module 130. The sealant 170 is filled into a gap between the wire material 160 and the bottom plate opening 152 of the bottom plate 150, so that the bottom plate 150 seals the second end surface 124 of the waterproof structure 120.

In this embodiment, the waterproof structure 120 is a material having relatively strong resilience and waterproof ability. When the material deforms under compression by an external force, the resilience thereof makes a contact interface between the material and an object tightly compressed to achieve a sealing effect. When the external force is reduced or removed, the deformed material quickly restores its original shape. Therefore, when the functional module 130 is disposed on the bottom plate 150 and the waterproof structure 120 is sleeved outside the functional module 130, a pressure is pre-applied from the bottom plate 150 toward the opening 112. In this way, under the resilience of the waterproof structure 120 after being compressed, the first end surface 122 of the waterproof structure 120 and the inner surface 114 of the housing 110 closely abut against each other to form a seal, and the second end surface 124 of the waterproof structure 120 and the bottom plate 150 closely abut against each other to form a seal. In this embodiment, the waterproof structure 120 is made of silica gel, but the disclosure is not limited thereto.

As can be seen from the above, the waterproof structure 120, the opening 112, and the bottom plate 150 jointly form an accommodating space extending from the opening 112 toward inside of the housing 110, and the functional module 130 is completely isolated from other elements in the electronic device 100. In this way, when water enters the accommodating space through the opening 112, water only exist in the gap between the waterproof structure 120 and the functional module 130, but water does not flow out of the waterproof structure 120 into the housing 110 to damage other electronic elements in the electronic device 100.

The electronic device 100 further includes a fixed member 180. The fixed member 180 directly or indirectly connects with the driving member 140 and the functional module 130, and fixes the driving member 140 and the functional module 130 in the housing 110. In this embodiment, the fixed member 180 includes a screw hole 182, and the fixed member 180 is fixed in the housing 110 by at least one screw, but the disclosure is not limited thereto. The fixed member 180 is near the opening 112 and the inner surface 114 of the housing 110, and surrounding a part of the waterproof structure 120, so that the waterproof structure 120 is limited in an area adjacent to the first end surface 122. In addition, the fixed member 180 also maintains the seal between the waterproof structure 120 and the inner surface 114.

In this embodiment, the electronic device 100 further has an actuation structure 142. One end of the actuation structure 142 is connected to the driving member 140, and the other end of the actuation structure 142 is connected to the bottom plate 150. In this embodiment, the actuation structure 142 is a part extending from the bottom plate 150. In other embodiments, the actuation structure 142 is an additional structure and is connected to the driving member 140 and the bottom plate 150. The driving member 140 of the electronic device 100 is disposed in the housing 110, and is configured to drive the bottom plate 150 and the functional module 130 to move away from the opening 112 along an axial direction R to a first position P1 (as shown in FIG. 3A) by the actuation structure 142. In this case, the functional module 130 is entirely located in the opening 112 and the side wall 126 of the waterproof structure 120. The driving member 140 is further configured to drive the bottom plate 150 and the functional module 130 to move toward the opening 112 along the axial direction R to a second position P2 (as shown in FIG. 3B) by the actuation structure 142. In this case, most of the functional module 130 is located outside the housing 110. In addition, in a process in which the bottom plate 150 moves from the first position P1 to the second position P2, because the bottom plate 150 moves toward the inner surface 114, the waterproof structure 120 is compressed along the axial direction R.

Specifically, the side wall 126 of the waterproof structure 120 of the electronic device 100 has a plurality of folding portions 128. The folding portions 128 are sequentially connected to the second end surface 124 starting from the first end surface 122. When the driving member 140 drives the bottom plate 150 to move away from the opening 112 along the axial direction R to the first position P1, the plurality of folding portions 128 is expanded away from each other, and the waterproof structure 120 has a first width W1 in a direction perpendicular to the axial direction R. When the driving member 140 drives the bottom plate 150 to move toward the opening 112 along the axial direction R to the second position P2, the plurality of folding portions 128 is stacked close to each other, and the waterproof structure 120 has a second width W2 in the direction perpendicular to the axial direction R. The second width W2 is greater than or equal to the first width W1.

To be specific, when the driving member 140 drives the functional module 130 to be retracted in the housing 110 or expanded out of the housing 110, the first end surface 122 of the waterproof structure 120 always closely abuts against the inner surface 114 of the housing 110, and the second end surface 124 moves along with the bottom plate 150, so that the folding degrees of the folding portions 128 of the side wall 126 are adjusted as the bottom plate 150 moves. The gap between the waterproof structure 120 and the functional module 130 provides space for the folding or expansion of the folding portions 128 of the waterproof structure 120. In addition, by the design of the folding portions 128, the waterproof structure 120 deforms regularly along with expansion and retraction of the functional module 130 relative to the housing 110, and therefore, friction between the deformed waterproof structure 120 and the functional module 130 is effectively avoided. In this way, the waterproof effect does not decrease with use times, so that the waterproof effect and reliability of the telescopic functional module 130 are maintained.

Figure 4A:
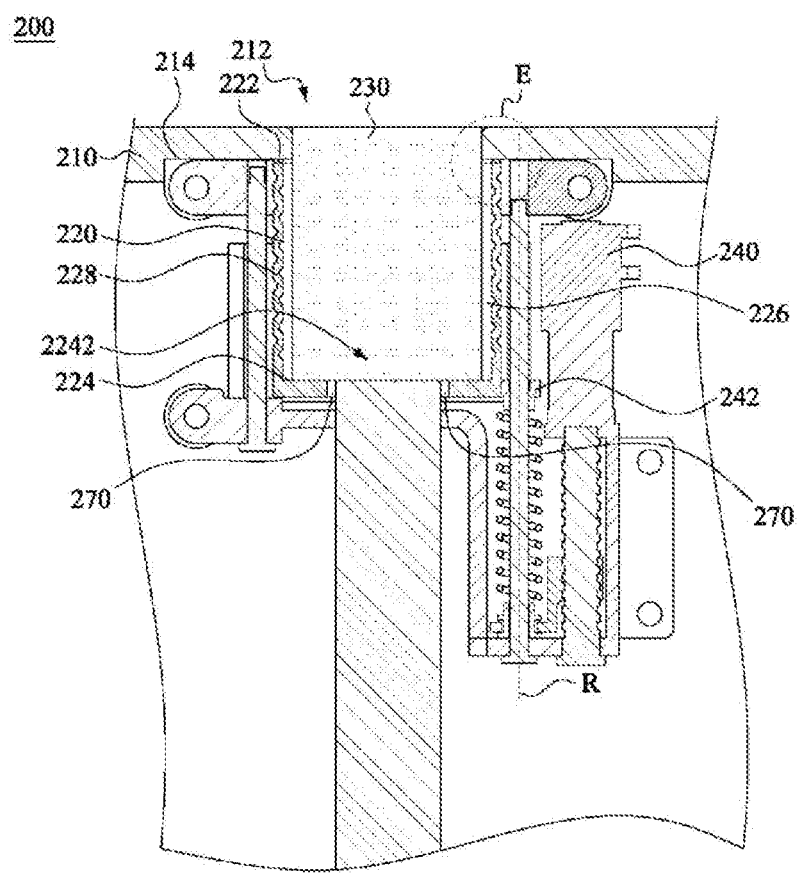
FIG. 4A is a cross-sectional view of an electronic device according to another embodiment of the disclosure after a part of a housing is removed.
Figure 4B:
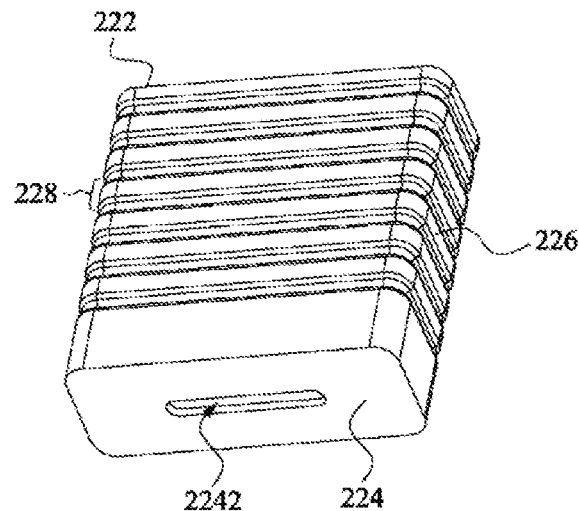
FIG. 4B is a three-dimensional view of a waterproof structure in FIG. 4A.

FIG. 4A is a cross-sectional view of an electronic device 200 according to another embodiment of the disclosure after a part of a housing 210 is removed. FIG. 4A has the same cross-sectional positions as FIG. 3A and FIG. 3B. FIG. 4B is a three-dimensional view of a waterproof structure 220 in FIG. 4A. Referring to both FIG. 4A and FIG. 4B, the electronic device 200 includes a housing 210, a waterproof structure 220, a functional module 230, and a driving member 240.

The housing 210 has an opening 212 and an inner surface 214 connected to each other. The waterproof structure 220 has a first end surface 222, a second end surface 224, and a side wall 226 connected with the first end surface 222 and the second end surface 224. The second end surface 224 has an end surface opening 2242. To be specific, the waterproof structure 220 is a semi-open bag structure. The first end surface 222 is an open end surface of the bag structure, and the second end surface 224 of the waterproof structure 220 covers a bottom of the functional module 230. Therefore, the functional module 230 is located in a space jointly formed by the opening 212 and the side wall 226 of the waterproof structure 220. In addition, the functional module 230 is not in contact with an inner wall of the waterproof structure 220, and there is a gap surrounding a periphery of the functional module 230.

The electronic device 200 further includes a wire material 260 and a sealant 270. The wire material 160 passes through the end surface opening 2242 of the second end surface 224 to connect to the functional module 130. The gap between the wire material 160 and the end surface opening 2242 is filled with the sealant 170 to seal the gap.

Figure 4C:
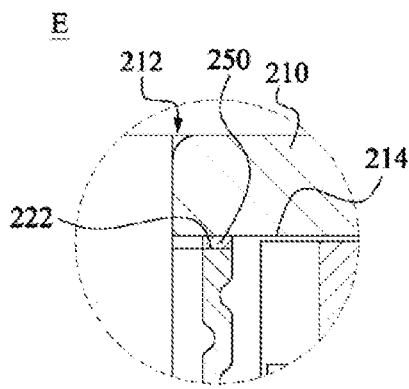
FIG. 4C is an enlarged view of a portion encircled by a dashed line E in FIG. 4A.

FIG. 4C is an enlarged view of a portion encircled by a dashed line E in FIG. 4A. The electronic device 200 further includes an adhesive layer 250, adhered between the first end surface 222 of the waterproof structure 220 and the inner surface 214 of the housing 210, to ensure a sealing connection between the first end surface 222 and the inner surface 214.

In this embodiment, the electronic device 200 further has an actuation structure 242. One end of the actuation structure 242 is connected to the driving member 240, and the other end of the actuation structure 242 is connected to the waterproof structure 220. The driving member 240 is configured to drive the waterproof structure 220 and the functional module 230 to move along the axial direction R toward the opening 212 or away from the opening 212 by the actuation structure 242.

In this embodiment, the side wall 226 of the waterproof structure 220 has a plurality of folding portions 228. When the functional module 230 and the waterproof structure 220 are driven by the driving member 240, the change features of the folding portions 228 of the side wall 126 are similar to those of the folding portions 128 in the embodiment of FIG. 3A and FIG. 3B, and therefore details are not described again.

In view of this, the waterproof structure 220 and the opening 212 jointly form an accommodating space extending from the opening 212 toward inside of the housing 210, and the functional module 230 is completely isolated from other elements in the electronic device 200. In this way, water enters and leaves the accommodating space through the opening 212. In addition, when water enters the accommodating space, the water is limited to exist in the gap between the waterproof structure 220 and the functional module 230. Therefore, water does not flow out of the waterproof structure 220 into the housing 210 to damage other electronic elements in the electronic device 200.

In addition, the gap between the waterproof structure 220 and the functional module 230 prevents the functional module 230 from friction with the waterproof structure 220 during expansion and retraction of the functional module 230, and therefore the waterproof effect does not decrease with use times, and the waterproof effect and reliability of the telescopic functional module 230 are maintained.

Figure 5A:
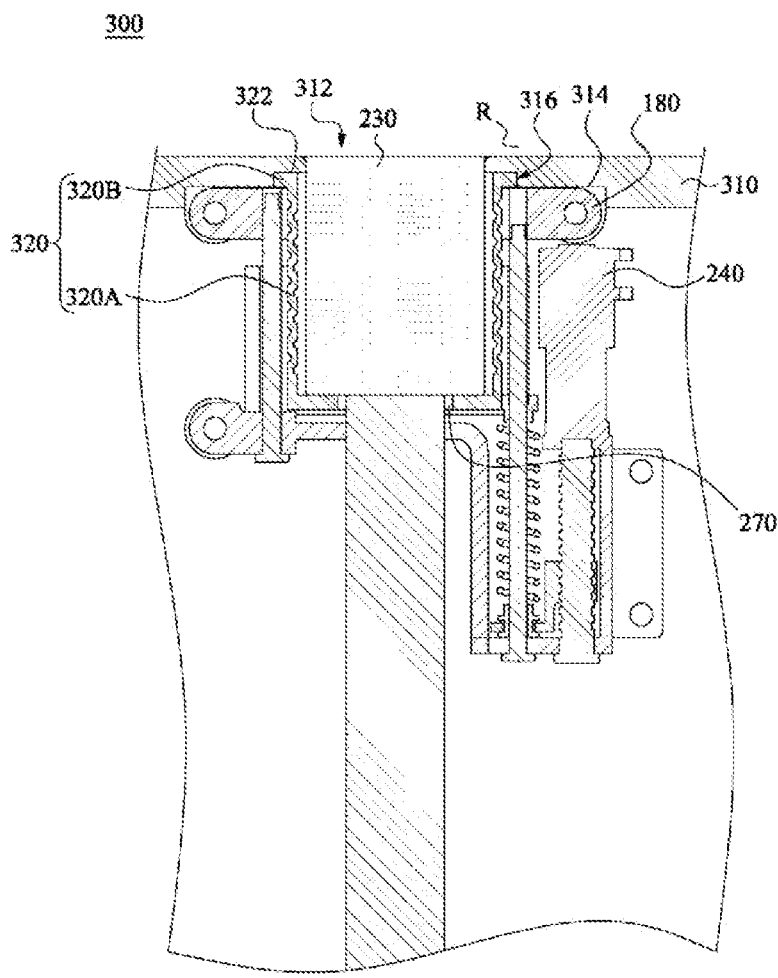
FIG. 5A is a cross-sectional view of an electronic device according to another embodiment of the disclosure after a part of a housing is removed.

FIG. 5A is a cross-sectional view of an electronic device 300 according to another embodiment of the disclosure after a part of a housing 310 is removed. The electronic device 300 includes a housing 310, a waterproof structure 320, a functional module 230, and a driving member 240. The electronic device 300 differs from the embodiment of FIG. 4A in that: the recessed area 316 is recessed from the inner surface 314 away from the waterproof structure 320, and is connected to the opening 312. To be specific, the inner wall of the recessed area 316 forms a part of the inner surface 314. The waterproof structure 320 has a body portion 320A and an extension portion 320B connected to each other. The extension portion 320B has a first end surface 322 away from the body portion 320A. The electronic device 300 does not have the adhesive layer 250, but has the fixed member 180 shown in FIG. 2.

Figure 5B:
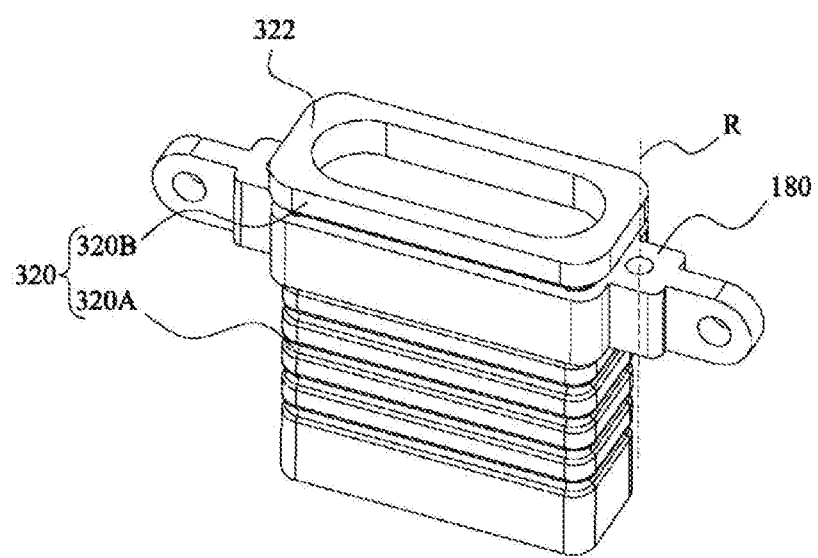
FIG. 5B is a three-dimensional view of a partial structure in FIG. 5A.

FIG. 5B is a three-dimensional view of a partial structure in FIG. 5A. Refer to both FIG. 5A and FIG. 5B. In this embodiment, the fixed member 180 is fixed in the housing 310, surrounding the body portion 320A of the waterproof structure 320, and is adjacent to the extension portion 320B. A width of the extension portion 320B in a direction perpendicular to the axial direction R is slightly greater than a width of the body portion 320A in the direction perpendicular to the axial direction R. The extension portion 320B of the waterproof structure 320 is clamped by the fixed member 180 and the inner surface 314 of the recessed area 316. In addition, the extension portion 320B of the waterproof structure 320 is engaged and accommodated in the recessed area 316, to ensure that the first end surface 322 closely abuts against the inner surface 314.

Although the disclosure has been described with reference to the above embodiments, the embodiments are not intended to limit the disclosure. A person skilled in the art may make variations and improvements without departing from the spirit and scope of the disclosure. Therefore, the protection scope of the disclosure should be subject to the appended claims.

What is claimed is:
1. An electronic device, comprising:
a housing, having an inner surface and an opening connected to each other;
a waterproof structure, having a first end surface, a second end surface, and a side wall connecting the first end surface and the second end surface, wherein the first end surface is tightly connected with the inner surface, and the second end surface of the waterproof structure has an end surface opening;
a functional module, disposed inside the waterproof structure;
a driving member, located in the housing and configured to drive the functional module to move toward or away from the opening;
a wire material, passing through the end surface opening, to connect to the functional module; and a sealant, disposed between the wire material and the end surface opening, to seal a gap between the end surface opening and the wire material.

2. The electronic device according to claim 1, wherein the electronic device further comprises a bottom plate, the bottom plate is located in the housing, and the second end surface of the waterproof structure is tightly connected with the bottom plate.

3. The electronic device according to claim 2, wherein the functional module is disposed on the bottom plate.

4. The electronic device according to claim 2, wherein the bottom plate has a bottom plate opening and the second end surface has an end surface opening, the bottom plate opening is disposed corresponding to the end surface opening, and the electronic device further comprises:
 a wire material, passing through the bottom plate opening and the end surface opening, to connect with the functional module; and
 a sealant, disposed between the wire material and the bottom plate opening, to seal a gap between the bottom plate opening and the wire material.

5. The electronic device according to claim 2, wherein the electronic device further comprises an actuation structure connected with the bottom plate and the driving member, and the driving member drives the bottom plate to move toward or away from the opening by the actuation structure.

6. The electronic device according to claim 5, wherein the driving member drives the bottom plate to move away from the opening along an axial direction to a first position by the actuation structure, and the driving member drives the bottom plate to move toward the opening along the axial direction to a second position by the actuation structure.

7. The electronic device according to claim 6, wherein the waterproof structure has a first width in a direction perpendicular to the axial direction when the bottom plate is located at the first position, and the waterproof structure has a second width in the direction perpendicular to the axial direction, and the second width is greater than or equal to the first width when the bottom plate is located at the second position.

8. The electronic device according to claim 1, wherein the electronic device further comprises an actuation structure, the actuation structure is connected with the waterproof structure and the driving member, and the driving member drives the second end surface and the side wall of the waterproof structure and the functional module to move toward or away from the opening by the actuation structure.

9. The electronic device according to claim 8, wherein the driving member drives the functional module to move away from the opening along an axial direction to a first position by the actuation structure, and the driving member drives the functional module to move toward the opening along the axial direction to a second position by the actuation structure.

10. The electronic device according to claim 9, wherein the waterproof structure has a first width in a direction perpendicular to the axial direction when the functional module is located at the first position, and the waterproof structure has a second width in the direction perpendicular to the axial direction when the bottom plate is located at the second position, and the second width is greater than or equal to the first width.

11. The electronic device according to claim 1, further comprising:
 an adhesive layer, adhered between the first end surface of the waterproof structure and the inner surface of the housing.

12. The electronic device according to claim 1, wherein the waterproof structure comprises a body portion and an extension portion connected to each other, and the electronic device further comprises:
 a fixed member, fixed in the housing and surrounding the body portion of the waterproof structure, wherein the extension portion of the waterproof structure is clamped between the fixed member and the inner surface of the housing.

13. The electronic device according to claim 12, wherein the housing has a recessed area, the recessed area is recessed from the inner surface to a direction away from the waterproof structure and the recessed area is connected to the opening, and the extension portion of the waterproof structure is further engaged and accommodated in the recessed area.

14. An electronic device, comprising:
 a housing, having an inner surface and an opening connected to each other;
 a waterproof structure, having a first end surface, a second end surface, and a side wall connecting the first end surface and the second end surface, wherein the first end surface is tightly connected with the inner surface;
 a functional module, disposed inside the waterproof structure;
 a driving member, located in the housing and configured to drive the functional module to move toward or away from the opening; and
 a bottom plate located in the housing, wherein the second end surface of the waterproof structure is tightly connected with the bottom plate, and the functional module is disposed on the bottom plate.

* * * * *